US009651629B2

(12) United States Patent
Fox et al.

(10) Patent No.: US 9,651,629 B2
(45) Date of Patent: May 16, 2017

(54) HARDWARE-IN-THE-LOOP GRID SIMULATOR SYSTEM AND METHOD

(71) Applicant: Clemson University, Clemson, SC (US)

(72) Inventors: John Curtiss Fox, Clemson, SC (US); Edward Randolph Collins, Clemson, SC (US); Nikolaos Rigas, North Charleston, SC (US)

(73) Assignee: Clemson University, Clemson, SC (US)

( * ) Notice: Subject to any disclaimer, the term of this patent is extended or adjusted under 35 U.S.C. 154(b) by 369 days.

(21) Appl. No.: 13/943,200

(22) Filed: Jul. 16, 2013

(65) Prior Publication Data

US 2014/0015555 A1    Jan. 16, 2014

Related U.S. Application Data

(60) Provisional application No. 61/672,133, filed on Jul. 16, 2012.

(51) Int. Cl.
*G01R 31/40* (2014.01)
*G01R 19/25* (2006.01)

(52) U.S. Cl.
CPC .......... *G01R 31/40* (2013.01); *G01R 19/2513* (2013.01)

(58) Field of Classification Search
None
See application file for complete search history.

(56) References Cited

U.S. PATENT DOCUMENTS 6,420,856 B1 *    7/2002 Sen ................. H02J 3/1878
                                              323/209

OTHER PUBLICATIONS

"Introduction to the Clemson University 15 MW Hardware-In-the-Loop Grid" by Fox et al. 2014.*
"The Clemson University Hardware-in-the-Loop Grid Simulator—Kickoff Meeting", Jul. 17, 2012 (66 pgs).
"The Clemson University Hardware-in-the-Loop Grid Simulator" Basis of Design and Technical Scope Review Webinar; Jan. 8, 2013 (30 pgs).

(Continued)

*Primary Examiner* — Paresh Patel
(74) *Attorney, Agent, or Firm* — John R. Perkins, Jr.; Perkins Law Firm, LLC

(57) ABSTRACT

A hardware-in-the-loop (HIL) electrical grid simulation system and method that combines a reactive divider with a variable frequency converter to better mimic and control expected and unexpected parameters in an electrical grid. The invention provides grid simulation in a manner to allow improved testing of variable power generators, such as wind turbines, and their operation once interconnected with an electrical grid in multiple countries. The system further comprises an improved variable fault reactance (reactive divider) capable of providing a variable fault reactance power output to control a voltage profile, therein creating an arbitrary recovery voltage. The system further comprises an improved isolation transformer designed to isolate zero-sequence current from either a primary or secondary winding in a transformer or pass the zero-sequence current from a primary to a secondary winding.

3 Claims, 12 Drawing Sheets

(56) References Cited

OTHER PUBLICATIONS

Nick Rigas, DSc: Randy Collins, PhD, Pe, Jim Tuten, M. Eng., Pe; Curtis Fox, MS, Tom Salem, PhD, Pe; Ben Gislason, Senior EE major, The Citadel; "The Clemson University Hardware-in-the-Loop Grid Simulator" Basis of Design and Technical Scope Review Webinar; Jan. 8, 2013 (30 pgs).
J. Curtiss Fox, "A Hybrid Method for Perfoming Fault Ride-Through Evaluations, In Partial Fulfillment of PhD Comprehensive Examination"; Feb. 26, 2013 (48 pgs).
J. Curtiss Fox; "A Hybrid Method for Performing Fault Ride-Through Evaluations, PhD Comprehensive Exam"; Apr. 22, 2013 (24 pgs).
"The Clemson University 15 MW Hardware-in-the-Loop Grid Simulator"; Clemson University (16 pgs), Mar. 2014.
J. Curtiss Fox, "The Variable Fault Reactance Device for Testing of Wind Turbine Generators" (21 pgs), Nov. 2010.

\* cited by examiner

US 9,651,629 B2

HARDWARE-IN-THE-LOOP GRID SIMULATOR SYSTEM AND METHOD

CROSS-REFERENCE TO RELATED APPLICATIONS

This application claims priority to U.S. Provisional Application No. 61/672,133 filed Jul. 16, 2012, which is incorporated herein by reference.

STATEMENT OF GOVERNMENT SUPPORT

The present invention is supported by government funding under Grant No. DE-EE-0005723 from the U.S. Department of Energy. The U.S. Government has certain rights in this invention.

BACKGROUND OF THE INVENTION

The invention relates to an electrical grid simulation system and, more particularly, to an improved system and method for grid simulation that combines a reactive divider with a variable frequency converter to better mimic and control both expected and unexpected parameters in an electrical grid. The invention provides grid simulation in a manner that allows improved testing of variable power generators—such as wind turbines, solar inverters, energy storage devices, and power conditioning equipment (such as STATCOMS)—and their operation once interconnected within an electrical grid in multiple countries. Further, this invention enables improved testing of power generation devices for use in multiple countries with varying voltages, frequencies, and other operational characteristics.

Prior art grid simulation systems are unable to adequately test variable power generation equipment for use in standard applications that require interconnection to the electrical grid found in most countries. That problem is compounded when the power generation equipment is extremely large. Newer generation wind turbines are now manufactured on the multi-megawatt level and current test beds for such devices are limited in capability to adequately test such large devices.

The deficiencies in prior art systems are further compounded by the fact that electrical grids vary internationally. A robust fault ride-through testing system is not available that can emulate the multiplicity of electrical grids and their operational characteristics.

Prior art testing for compatibility and interoperability is often accomplished entirely with simulation or with hardware systems that offer limited fidelity in simulating real-world grid conditions or compatibility standards. Systems that can simulate steady-state conditions can often only do so at one frequency or at a limited range of grid variation and cannot replicate fault or widely dynamic conditions. Hardware devices for testing dynamic conditions, such as faults, are typically interconnected with a utility system and, therefore, limited in capability by that utility. It is also important to note that these systems subject the utility electrical grid to dynamic conditions that could be detrimental to its operation.

What is needed is a grid simulation system that will provide better control of a simulated grid to simulate faults and other parameters both expected and unexpected. An electrical fault on the level needed for testing ride-through capability of wind turbines, for example, is exceedingly difficult to create and control. It is therefore difficult with present systems to fully evaluate grid compatibility for multi-megawatt generators and similar devices such as power conditioning devices and loads.

Accordingly, an object of the present invention is to provide a grid simulation system that will provide the operator better control of the simulated grid, wherein the operator may more accurately, and with better control, simulate expected and unexpected parameters within the grid. Further, by using models of a real utility grid, the simulated grid could react and interact with the device(s) under test in a manner consistent with that expected in a real system. Such functionality might be achieved by using a real-time computer-based simulation that controls the hardware of the simulated grid and interfaces with it using appropriate sensor feedback.

Another object of the present invention is to provide a variable grid simulation system that will allow operators to evaluate grid compatibility for large generators in multiple other countries. More specifically, a robust fault ride-through (FRT) system with hardware-in-the-loop (HIL) capability is needed to properly emulate electrical grids found in multiple countries so that large generators may be fully tested for compatibility before installation into multiple types of electrical grids.

Another object of the invention is to provide an improved variable fault reactive device (VFRD) to allow for low-voltage ride-through (LVRT) and zero-voltage ride-through (ZVRT) testing of large generators to more accurately represent the testing and fault ride-through requirements of current and future grid codes.

Another object of the invention is to provide improved isolation transformers to provide more flexibility in fault testing for such systems.

Other objects and benefits of the present invention will become apparent from the detailed description when taken in conjunction with the drawings provided.

SUMMARY OF THE INVENTION

The foregoing objects have been achieved in the present invention, whereby the present invention overcomes the above identified and other deficiencies in conventional grid simulation systems and methods. These objectives are accomplished by providing a grid simulation system that includes a system for emulating various conditions in an electrical grid comprising a reactive divider operably connected to a variable frequency converter so as to better mimic and control expected and unexpected parameters in an electrical grid.

The reactive divider portion is more specifically described as an improved variable fault reactive device (VFRD) that has been adapted to the system. The improved VFRD may be used in the variable frequency converter system and it can also operate outside the system in conjunction with, for example, a utility grid. The design goal of the improved VFRD was to allow for Low Voltage Ride-Through (LVRT) and Zero Voltage Ride-Through (ZVRT) testing of wind turbine generators (WTGs) (or any other device required to ride through fault events) to more accurately represent the testing requirements of current and future grid codes. The voltage recovery profile for many LVRT and ZVRT withstanding curves and real world fault events include a slow recovery in voltage from the in-fault voltage, otherwise known as the bus voltage during a fault. Coupled with the power amplifier, the improved VFRD uses the concept of variable reactance to control the voltage profile and hence create an arbitrary recovery voltage when connected to the power amplifier. In this context, arbitrary means that the user/operator can designate a recovery profile from a large variety of options. Using the taps and switches a stepped recovery is also possible. The improved VFRD is capable of performing balanced and unbalanced voltage sags corresponding to either three-phase, line-to-line, double line-to-ground, and single line-to-ground faults.

The improved VFRD operates by using the principle of a voltage divider circuit, in which the voltage supplied to the terminals of the WTG is reduced through the use of a reactive impedance divider with respect to the utility interconnection. The variable voltage is achieved by shifting reactance between the series and shunt elements of the reactive divider though the use of staged series-connected reactor stacks. In another embodiment, staged parallel-connected reactors could be used but the expense could be cost prohibitive.

The staged reactors in the improved VFRD allow for relatively precise control of both the fault voltage at the terminals of the WTG and the fault current seen by the utility during testing. The staged reactor stacks are controlled via AC solid-state switches constructed from anti-paralleled thyristors. To limit transients and facilitate smooth transitions of the series impedance, the series switches operate at the zero crossing of their respective reactor stack's current. The shunt SCR switches are connected in series with the shunt impedance and provide increased point-in-wave control useful for fault ride-through testing. Other embodiments of these switching devices could include mechanical or other electronic switching designs.

The invention further comprises an improved isolation transformer. Specifically, the improved transformer is designed to isolate zero-sequence current from either the primary or secondary winding (both wye connected windings) or, with the operation of switching devices, allow for zero-sequence current and voltage to pass from the primary to secondary windings. Zero-sequence current is defined at both the fundamental frequency and all harmonic frequencies, although normally prevalent in power systems as triplet multiples (three times) of the fundamental frequency.

A basic aspect of the improved design that allows for either isolation or passing of the zero-sequence current is the addition of a tertiary delta winding with a switching device on one corner (sometimes referred to as an "open corner delta"). This delta winding can be designed to operate without load or with load. With the open corner of the delta winding short circuited, the delta presents a low impedance path to zero-sequence current on either the primary or secondary winding. With this low-impedance path, the primary or secondary winding can operate in an ungrounded-wye manner without the adverse effects of driving zero-sequence current through the magnetizing core, resulting in high zero-sequence fluxes and significant voltage distortions. Additionally, due to the circulation of zero-sequence current in the delta connection, additional impedance can be added in series with the delta switch such that the zero-sequence impedance seen from either the primary or secondary windings is increased.

Conversely, if the delta switch is opened, both the primary and secondary windings can be effectively grounded (or connected to a system neutral) such that a proper wye-wye winding is created and the delta has little to no impact on the circuit. With this connection, the improved isolation transformer will allow for the transmission of zero-sequence current from the primary to the secondary winding.

A three-limb core, as is standard in distribution transformers, does not allow a zero-sequence flux path, resulting in all magnetization of the zero-sequence voltage required through the tank. The tank is commonly referred to as the enclosure and surrounding air of the transformer. Because the reluctance of the tank is relatively high compared to standard core materials, the magnetizing current required to pass zero-sequence voltage through the transformer is significantly greater than that of fundamental positive sequence magnetizing current. To correct for this high magnetizing current, a 5-limb core (or effective equivalent low reluctance, zero-sequence flux path) can be utilized. This can be accomplished with multiple single-phase transformer, a 5-limb, three-phase transformer, or a combination of both.

As to the system overall, an electrical bus of the electric grid simulator is established by a large power-electronic-based power amplifier. When this amplifier simulates fault conditions (or other dynamic events occur or are simulated), the connected devices under test can deliver large currents to the amplifier. To avoid damage, and for controlled operation during the simulated fault, redirecting these currents from sensitive power electronic devices is required. One path to redirect the currents is to a reactance connected via switches on the AC bus. These reactances are in a shunt connection and thus must handle current from both the device under test as well as from the amplifier itself. Another embodiment of the invention is to redirect the currents within the amplifier. This can be accomplished by appropriate power-electronic converter topologies. These topologies can include energy absorbing circuits placed within the power converter itself, such as dynamic braking resistors or other similar energy-absorbing devices. The energy absorbing circuits could include circuits that redirect the energy back to another grid, an energy storage device, the energy absorbing device, or the like.

A method for emulating various conditions in an electrical grid is further provided comprising the steps of using a reactive divider operably connected to a variable frequency converter so as to better mimic and control expected and unexpected parameters in an electrical grid.

The invention further includes a system for emulating various conditions in an electric grid comprising a system grid including a large power-electronic-based power amplifier that, upon simulating a fault condition or other dynamic events in an electrical system, is capable of receiving large electrical currents from other devices connected to said electrical system without sustaining damage.

A method is also provided for preventing damage to sensitive power electronic devices in a system for emulating an electric grid comprising the steps of redirecting the currents to a reactance in a shunt connection via switches on the alternating current bus of said system. This method may also include the steps of redirecting the currents within the amplifier using an appropriate power-electronic converter topology, such as an energy absorbing circuit placed within the power converter itself such as dynamic braking resistors, or other similar energy-absorbing devices.

Further objectives are accomplished by providing an improved VFRD to allow for LVRT and ZVRT testing of large generators to more accurately represent the testing requirements of current and future grid codes. More specifically, a system is provided that is capable of providing variable, reactive-output impedance in order to control a voltage profile, therein creating an arbitrary recovery voltage.

More specifically, an embodiment of the invention comprises an electrical grid simulation system comprising a reactive divider operatively connected to a variable frequency converter, whereby the system provides grid simulation to mimic and control both expected and unexpected parameters within an electrical grid. This aspect of the invention optionally includes a power amplifier, wherein the amplifier may comprise two or more quadrants and a multiplicity of phases. The amplifier can also be a 3-wire or 4-wire design and include electronic switches.

The invention further comprises a multi-phase reactive divider operating as a variable fault reactive device comprising a reactive impedance divider comprising one or more reactors per phase. The reactive divider can be operatively configured to perform balanced and unbalanced voltage sags corresponding to one of a three-phase fault, line-to-line fault, double-line-to-ground fault, and a single-line-to-ground fault. It is also possible that is includes one or more reactors are controlled by AC solid-state switches comprising anti-paralleled thyristors. The one or more reactors can in turn comprise staged, series-connected reactor stacks with switching means for controlling the one or more staged, series-connected reactor stacks. The reactive divider is also capable of providing a variable reactive output impedance to control a voltage profile, therein creating an arbitrary recovery or fault voltage.

The invention also comprises an isolation transformer which may comprise a tertiary delta winding and a switching means for controlling connection of said tertiary delta winding operatively connected to at least one corner of said tertiary delta winding, where the isolation transformer is operatively configured to isolate zero-sequence current from one of a primary winding in a test transformer and a secondary winding in said test transformer, and allow said zero-sequence current to pass from said primary winding in said test transformer to said secondary winding in said test transformer. This isolation transformer also comprises an additional impedance means in series with said switching means to increase zero-sequence impedance and may also comprise a core with 5 limbs.

The invention further comprises a power amplifier for establishing an electrical bus within an electrical grid simulator comprising a power converter capable of directing current within said power amplifier using energy absorbing means, wherein said power amplifier is operatively connected to a computing means capable of controlling said power amplifier to operate within an electrical grid simulation. The power amplifier and its components can be configured in many ways. For example, the computing means can receive sensed electrical parameters from one of a simulated grid bus and simulated grid device; can comprise a real-time digital simulator; can control the power amplifier to operate within an electrical grid simulation by running simulations of power systems in real-time; can output controls to cause the power amplifier to operate as a simulated electrical bus for a simulated electrical device connected to said electrical bus during simulation of an electrical grid; can output one of a user-defined voltage profile or a voltage profile representing one of a grid code and grid standard. As discussed herein, the reactive divider can be operatively connected to a variable frequency converter.

The power amplifier further comprises means to provide multi-level amplification and at least two quadrants for providing multi-level amplification. It may also comprise a multiplicity of phases and electronic switches.

The invention also comprises a method for preventing damage to power electronic devices in a system for emulating an electric grid comprising redirecting the currents within the amplifier using an appropriate power-electronic converter topology, wherein said appropriate power-electronic converter topology comprises an energy absorbing circuit placed within said power converter. In the method, the energy absorbing circuit placed within said power converter comprises dynamic braking resistors. The energy absorbing circuit is capable of redirecting the energy from said currents back to one of another grid, an energy storage device, and an energy-absorbing device.

The invention also comprises a method of using a reactive divider to simulate a fault within an electrical grid, where the method comprising the steps of: connecting a first variable inductor in series with a power amplifier to allow the passage of current from a simulated bus grid to a utility bus grid; connecting a second variable inductor in parallel with said first variable inductor, connected in series with said power amplifier, to allow the passage of current from said simulated bus grid to ground simultaneously with the passage of current from said utility bus grid to ground, to create a simulated electrical fault; and adjusting said second variable inductor to increase or decrease the reactance appearing on said utility bus grid to adjust the impact of said simulated electrical fault. This method may optionally comprise the step of adjusting said first variable inductor to increase or decrease the reactance appearing on said utility bus grid to further adjust the size of said simulated electrical fault.

Yet further objectives are accomplished by providing an improved isolation transformer to provide more flexibility in fault testing for such systems. More specifically, an improved isolation transformer is provided for isolating zero-sequence current from either a primary or secondary winding in a transformer comprising an additional tertiary delta winding operably connected to a switching device. This may also include an improved isolation transformer for allowing zero-sequence current to pass from a primary to a secondary winding comprising an additional tertiary delta winding operably connected to a switching device.

DETAILED DESCRIPTION OF THE PREFERRED EMBODIMENTS

Figure 1:
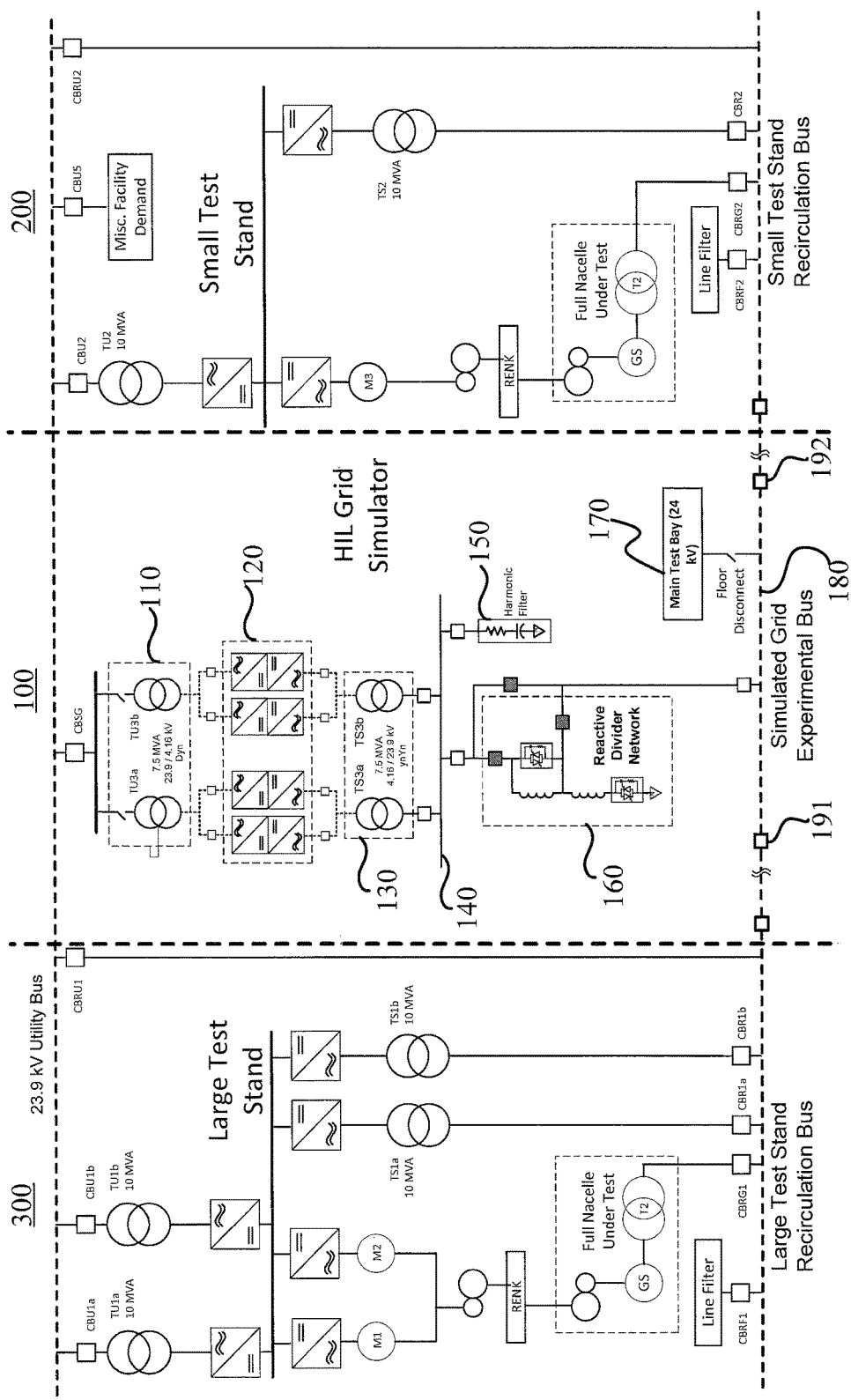
FIG. 1 is a one-line diagram of an embodiment of the invention illustrated within a large and small test stand.

The invention is perhaps better understood with reference to the drawings attached hereto. Referring now to FIG. 1, an embodiment of a HIL grid simulator 100 is illustrated as connected to a small test stand 200 and a large test stand 300. The utility side transformer(s) portion 110 is attached to the variable frequency drive 120, which is in turn connected to the simulated grid side transformer(s) 130. The power amplifier bus 140 connects to a harmonic filter 150, the reactive divider network 160, and the simulated grid side transformer(s) 130. A simulated grid experimental bus 180 connects to a main test bay 170. The simulated grid 180 electrically connects to the small test stand 200 through breaker 192 and to large test stand 300 through breaker 191. The simulated grid bus 180 is capable of being connected to bus 140 either through the reactive divider network 160 or through a bypass breaker directly connecting bus 180 to bus 140. It is at the simulated grid bus 180 that a device under test would be connected and would be the electrical point at which a simulated fault is to be placed.

Figure 2:
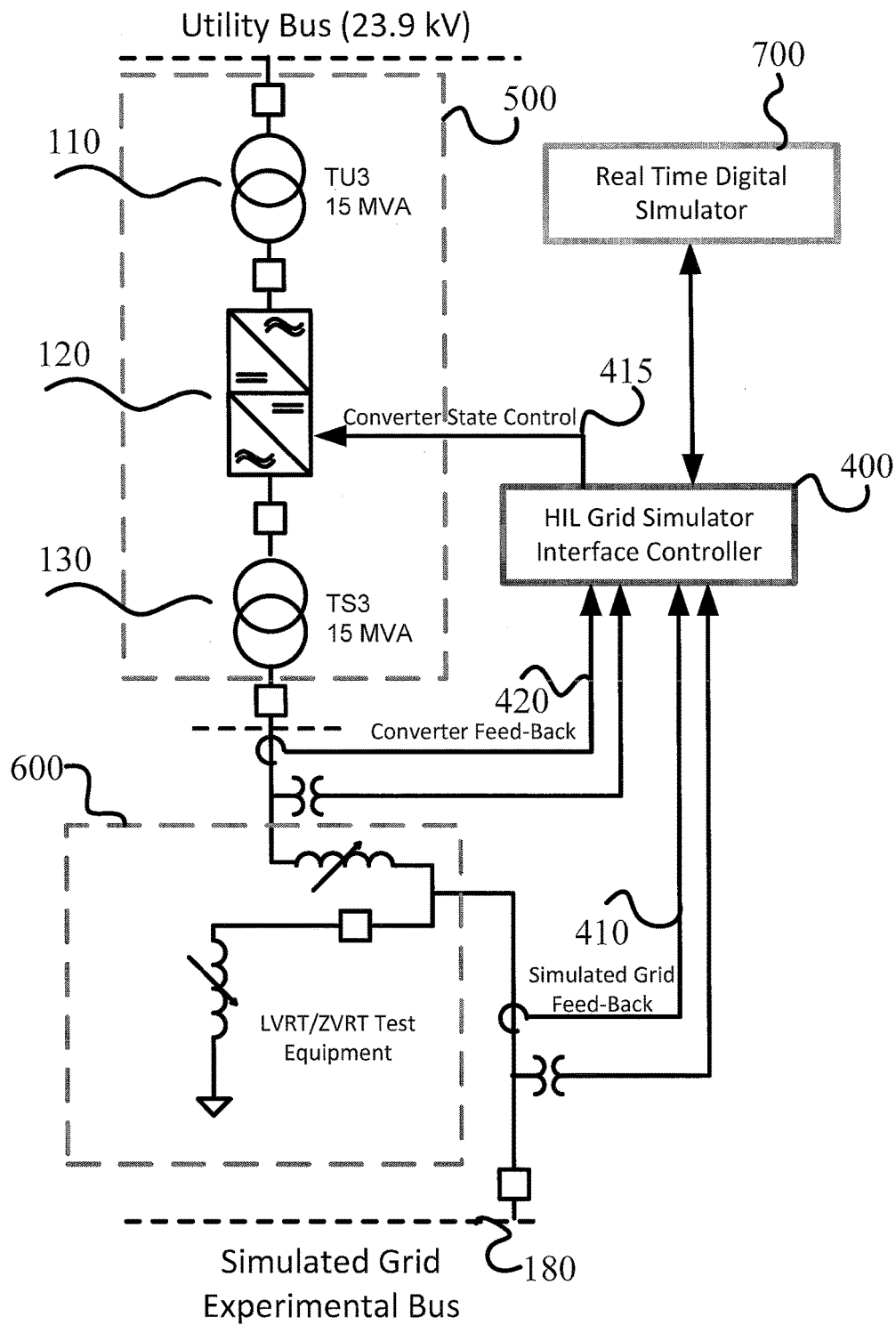
FIG. 2 is a one-line diagram of an embodiment of the invention illustrating various components.

Referring now to FIG. 2, larger sections of an embodiment of the invention are illustrated. HIL grid simulator interface controller 400 is operatively connected to control the power amplifier 500, reactive divider network 600, and can be optionally connected to a real-time simulator 700 when controlling the voltage of the simulated grid bus 180.

Here the power amplifier 500 comprises the utility side transformer(s) 110, the variable frequency drive 120, and the simulated grid side transformers(s) 130. FIG. 2 demonstrates that the HIL grid simulator interface controller 400 is capable of sensing the voltage and current at the converter feedback point 420 and the simulated grid feedback point 410. Other sensing points for parameters of interest could also be used. The HIL grid simulator interface controller 400 is capable of using these sensing points to control and modify the output voltage of the power amplifier 500 as indicated by control connection 415. By controlling and modifying the output voltage of the power amplifier 500 with the controller, the voltage disturbances seen at the simulated grid bus 180 by operation of the reactive divider network 600 can be more tightly bounded.

In this example, the HIL grid simulator interface controller 400 is in control of the voltage and frequency of the power amplifier 500 and the simulated grid bus 180. It is also possible for the HIL grid simulator interface controller 400 to receive voltage and frequency commands from an external source as further illustrated in FIG. 2. A standard computer can be configured and operatively connected to HIL grid simulator interface controller 400 to operate as a real-time digital simulator 700 to generate voltage and frequency commands.

In addition, the HIL grid simulator interface controller 400 is also capable of feeding back into a real time digital simulator 700 the voltage and current measurements from the converter feedback point 420 and the simulated grid feedback point 410. In feeding these voltage and current measurements back into the real time digital simulator 700, the real time digital simulator 700 voltage and frequency references can be adjusted based upon the power system simulation model to properly reflect the output voltage and frequency that the HIL grid simulator interface controller 400 will command to the power amplifier 500. This is known as hardware-in-the-loop testing, where the device under test connected to the simulated grid bus 180 is dynamically interacting with a model of a larger power system running on the real time digital simulator 700. In such a system, hardware is effectively connected to the simulated grid bus 180 within the power system simulation loop being performed by the real time digital simulator 700.

The role of the HIL grid simulator interface controller in such an operation is to ensure that the power amplifier 500 and the reactive divider network 600 are controlled in such a fashion that the voltage and frequency at the simulated grid bus 180 corresponds to the dynamic references being generated by the real time digital simulator 700. Such a system can provide both steady state and transient conditions at the simulated grid bus 180 that correspond to the conditions at a simulated bus in the computer's model provided by the real time digital simulator 700. One skilled in the art would recognize that other embodiments could include computer systems running simulation software and models, or conditions such as those captured in the field or determined by the user, to drive the interface controller 400.

Figure 3:
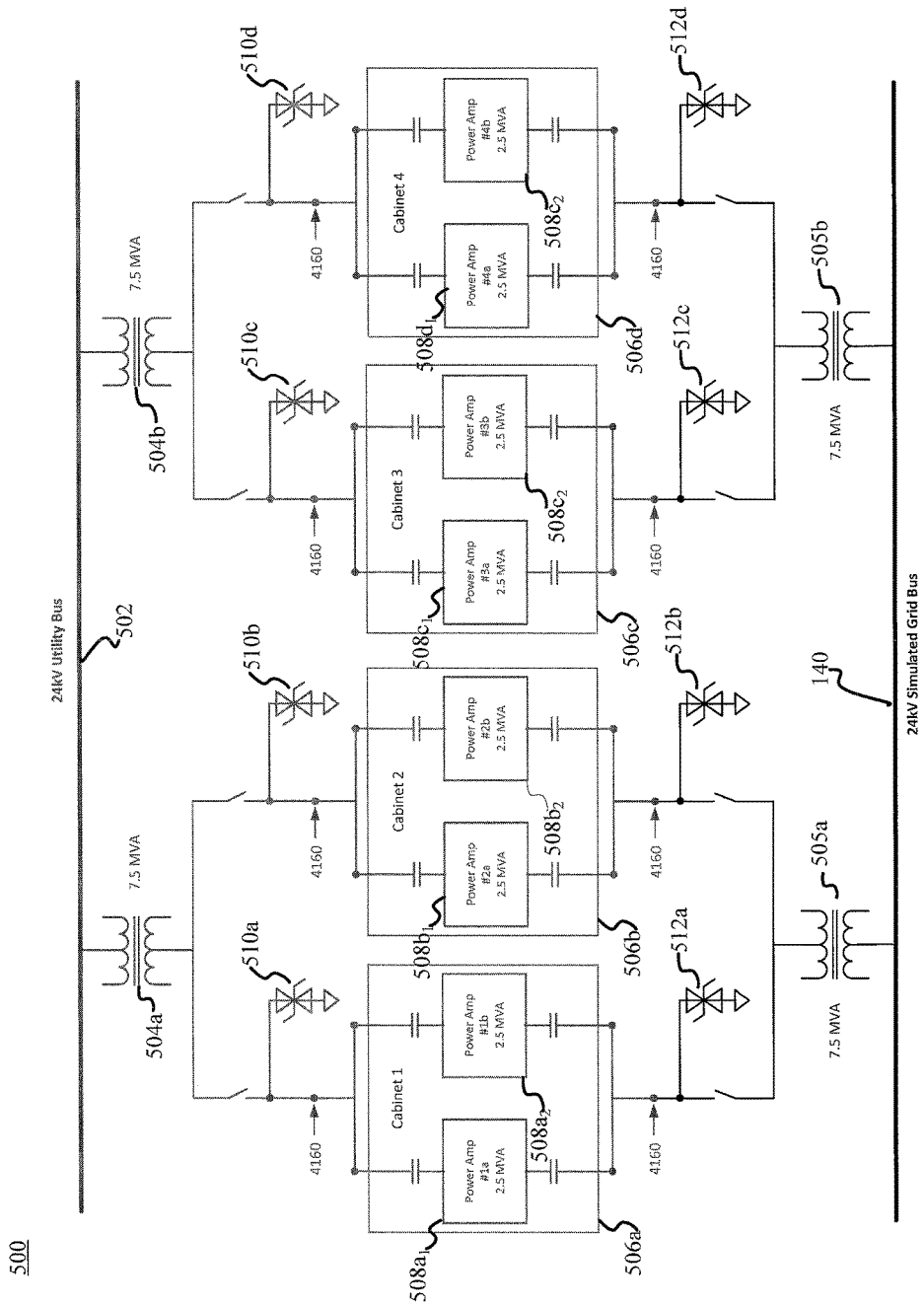
FIG. 3 is a one-line diagram of an amplifier layout as seen in an embodiment of the invention.

Amplifier 500 is illustrated in a more detailed embodiment in FIG. 3. A typical 24 kV utility bus 502 delivers power through two 7.5 MVA transformers 504a and 504b. These two 7.5 MVA transformers 504a and 504b could represent the utility side transformers 110 illustrated in FIG. 2. Four individual cabinets 506a, 506b, 506c, and 506d house dual 2.5 MVA power amplifiers 508a1, 508a2, 508b1, 508b2, 508c1, 508c2, 508d1, and 508d2, respectively, and could collectively operate as the variable frequency converter 120 of FIG. 2.

Surge arrestors and input contactors 510a, 510b, 510c, and 510d are used for disconnect and protection from voltage surges on the utility side, while surge arrestors and input contactors 512a, 512b, 512c, and 512d are used for disconnection and protection from voltage surges on the simulated bus side. The output of the power amplifier sections 506 is again recombined into two 7.5 MVA transformers 505a and 505b. These two 7.5 MVA transformers 505a and 505b operate as the simulated grid side transformer(s) 130 shown in FIG. 2.

In another embodiment of the invention, the simulated grid side transformer(s) 505a and 505b (shown in FIG. 2 as transformers 130) can be omitted from the application and the variable frequency drive 120 of FIG. 2 can be directly connected to the reactive divider network 600.

Figure 4:
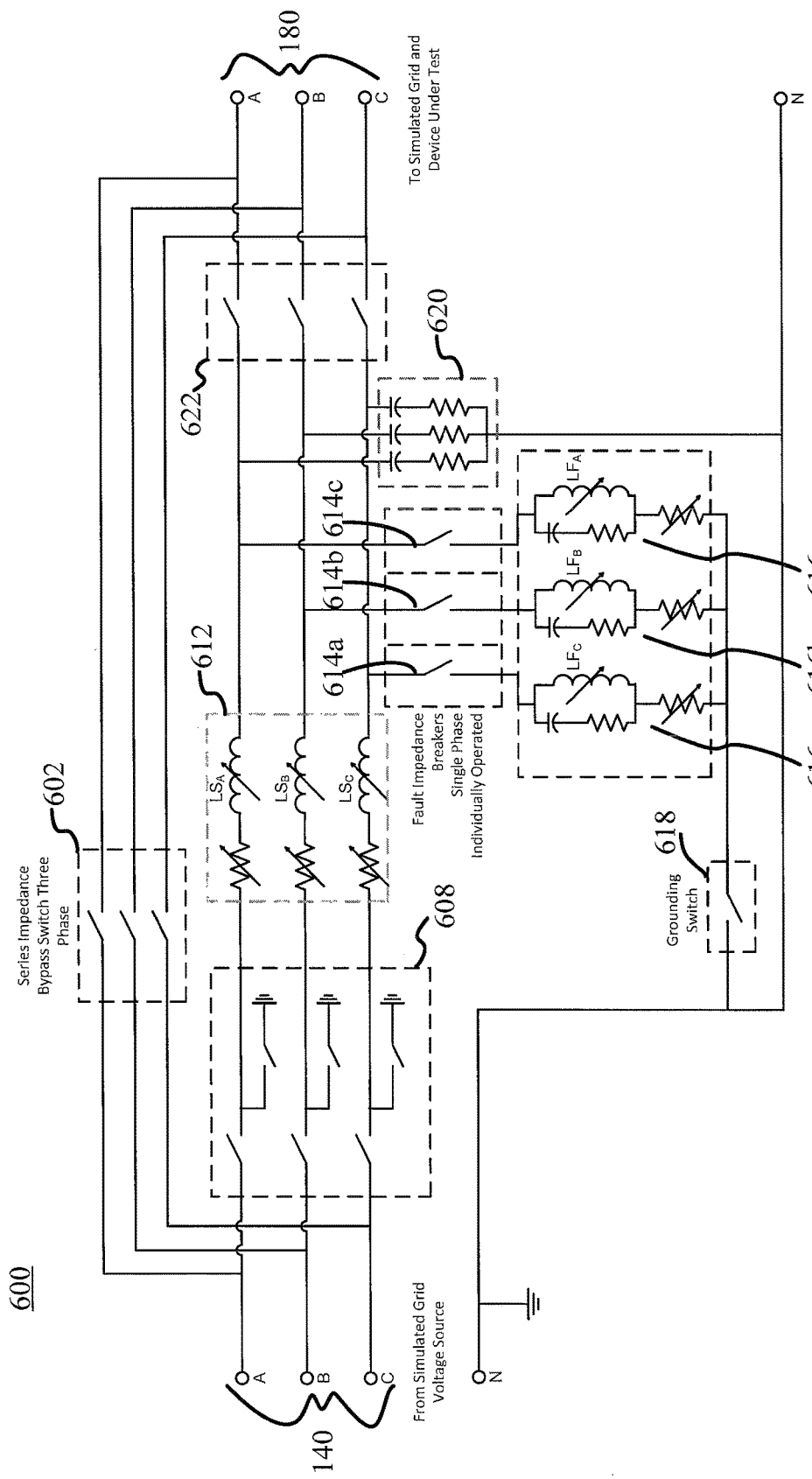
FIG. 4 is a 71-page Technical Proposal disclosing various aspects and embodiments of the invention.

Reactive divider 600 is illustrated in more detail in FIG. 4. A three-phase series impedance bypass breaker 602 is provided to insert and remove the series impedance of the reactive divider from the circuit between the power amplifier and the simulated grid bus. When 602 is opened, current must flow from the power amplifier bus 140 through the reactive divider network to the simulated grid bus 180. When 602 is closed, the current can flow directly from the power amplifier bus 140 to the simulated grid bus 180, bypassing the entire reactive divider network. Isolation and grounding switches 608 and 622 are provided on each side of the reactive divider network for safety and maintenance.

The series impedance of the reactive divider network comprises a number of components beginning with variable impedance 612. Fault impedance switches 614a, 614b, and 614c can be individually operated to simulate ground faults on one or more individual phases by sending current through variable shunt impedances 616a, 616b, and 616c, when grounding switch 618 is closed. If grounding switch 618 is opened, the variable shunt impedances are connected to a common floating wye point to allow for line-to-line faults by closing only two of the fault impedance breakers 614a, 614b or 614c. A snubber circuit 620 is also provided to limit any transient surge voltages created by switching the inductors.

Inherently, the depth of the voltage dip seen at the simulated grid bus 180 can be derived by taking the Thevenin equivalent on a per phase basis given the series impedances, shunt impedances, and the voltage of the power amplifier bus 140.

Figure 5:
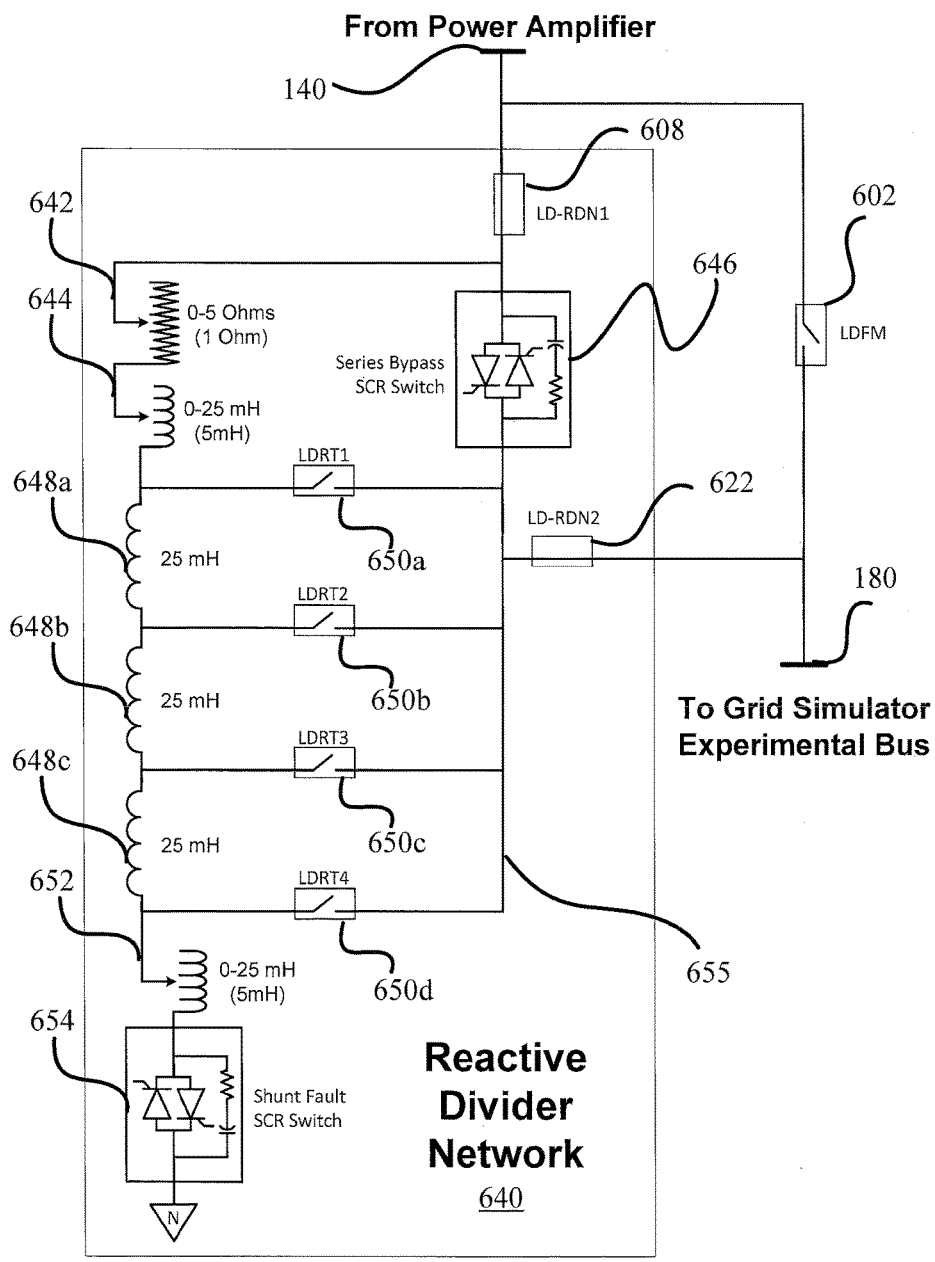
FIG. 5 is a one-line of a reactive divider as may be found in an embodiment of the invention.

Another view of an embodiment of the reactive divider is provided in FIG. 5. This illustration expands upon the three-phase system of the reactive divider of FIG. 4 and depicts a single-phase view that embodies a practical implementation of a reactive divider network. Here, tapped and fixed impedances can be combined to achieve a high degree of variable discrete step sizes in impedance.

FIG. 5 also includes two series bypass switches, a three-phase series impedance bypass breaker 602 and a more sophisticated SCR series bypass switch 646. The SCR series bypass switch 646 is a three-phase, single-phase operated, solid state AC switch comprised of antiparallel thyristors. The fault impedance switches 614a, 614b, and 614c from FIG. 4 have been replaced in FIG. 5 with more sophisticated SCR shunt fault switches 654. By using a solid state AC switch instead of a standard circuit breaker or contactor, more precise control can be obtained over the point in wave (i.e., phase angle) that the switch turns on and off. This improves the control of the system with the HIL grid simulator interface controller.

Figure 6:
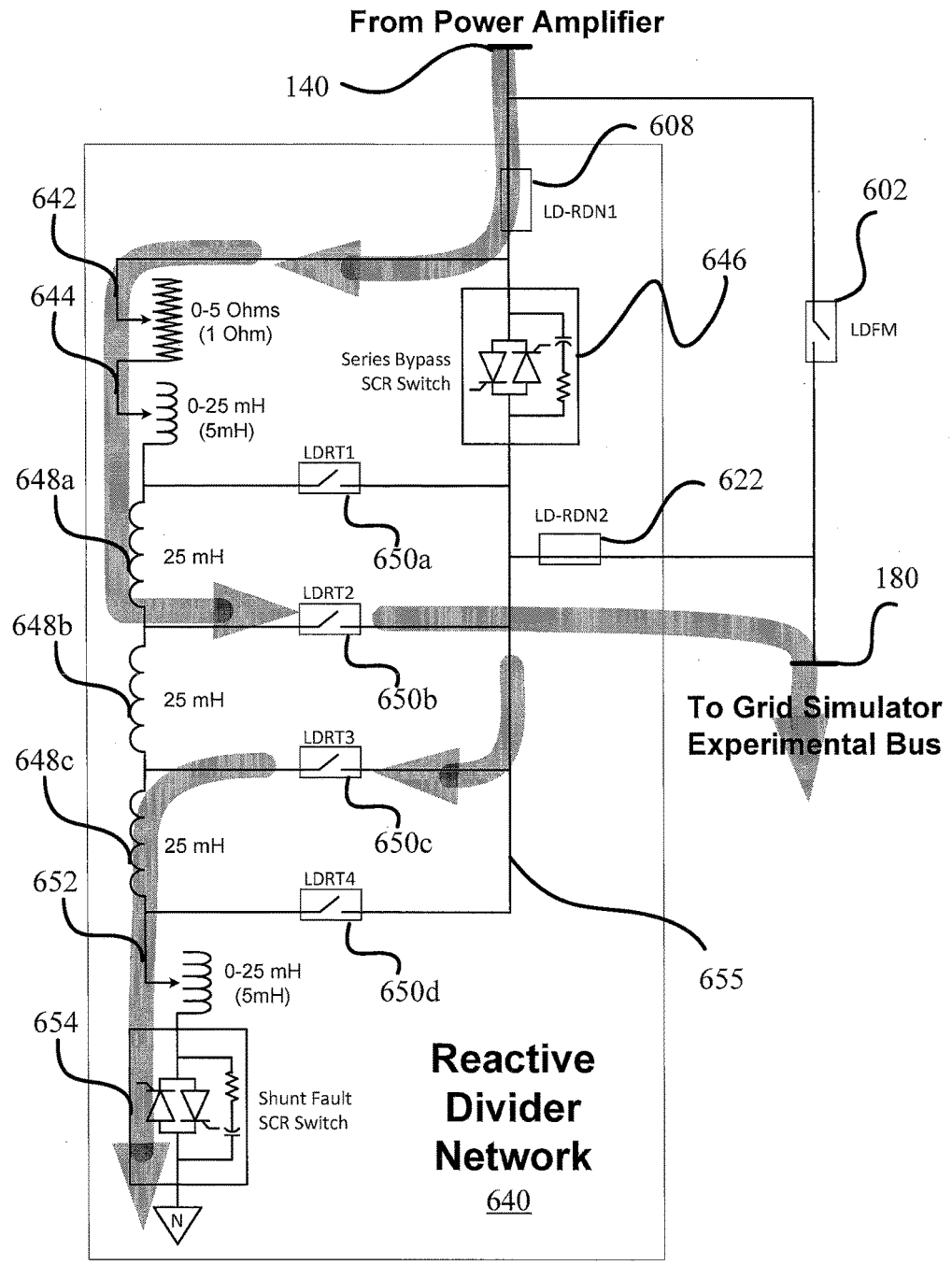
FIG. 6 is a one-line of a reactive divider as may be found in an embodiment of the invention, illustrating the flow of power.

Here the reactive divider network 640 is operative so as to deliver or receive power from power amplifier bus 140 to grid simulator bus 180, as further illustrated in FIG. 6. FIG. 5 indicates that power flows through tapped resistor 642 and tapped inductor 644, which form part of the series impedance. The SCR series bypass switch 646 connects between the reactive divider network point of common coupling 655 and power amplifier bus 140. Breakers 650a, 650b, 650c and 650d connect the reactive divider network point of common coupling 655 to the junction points of the series connected bank of inductors 648a, 648b, and 648c. By selection of the open/close position of breakers 650a, 650b, 650c and 650d, inductors 648a, 648b, and 648c can be moved to either the series impedance, the shunt impedance, or bypassed.

With switch 650a shown as open in FIG. 5, current must flow through fixed inductance 648a, which forms the rest of the series impedance, and through 650b to the reactive divider network point of common coupling 655. If 650c were closed and 650d were open, current could then flow through a second fixed inductance 648c and a tapped inductance 652, which is part of the shunt impedance. Generally, however, the current flowing in the shunt impedance is controlled by SCR shunt fault switch 654 and only flows when a fault is being simulated.

FIG. 6 further illustrates the effect by using arrows to indicate power flow when shunt fault SCR switch 654 is use to open or close portions of the network. If, for example, SCR shunt fault switch 654 is open and SCR series bypass switch 646 is open, current flows along the path designated in the upper portion of FIG. 6, i.e., from power amplifier bus 140 through the series impedance comprised of 642, 644 and 648a to grid simulator bus 180. If instead SCR shunt fault switch 654 were closed and SCR series bypass switch 646 remained open, current would flow along the path designated in the upper and lower portions of FIG. 6, i.e., from power amplifier bus 140 through the first series impedance comprised of 642, 644 and 648a to the reactive divider network point of common coupling 655, then through a second series impedance comprising 648c and 652, then to grid simulator bus 180.

Figure 7:
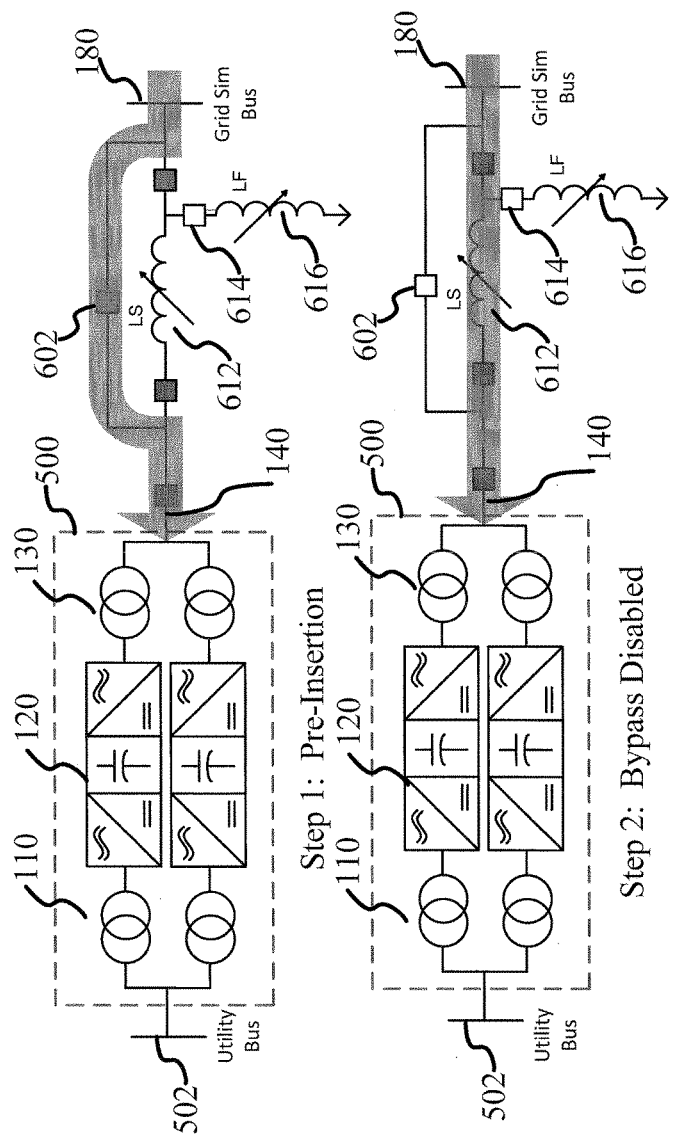
FIG. 7 is a one-line diagram indicating the first two steps in a reactive divider fault simulation method of using an embodiment of the invention.
Figure 8:
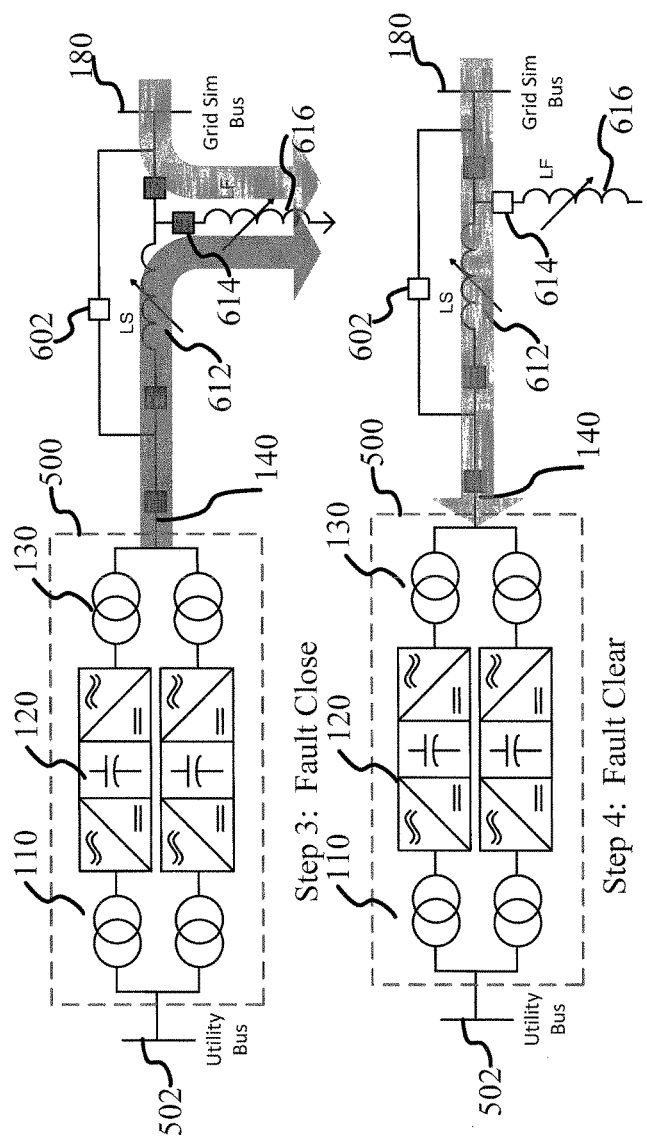
FIG. 8 is a one-line diagram indicating the third and fourth steps in a reactive divider fault simulation method of using an embodiment of the invention.
Figure 9:
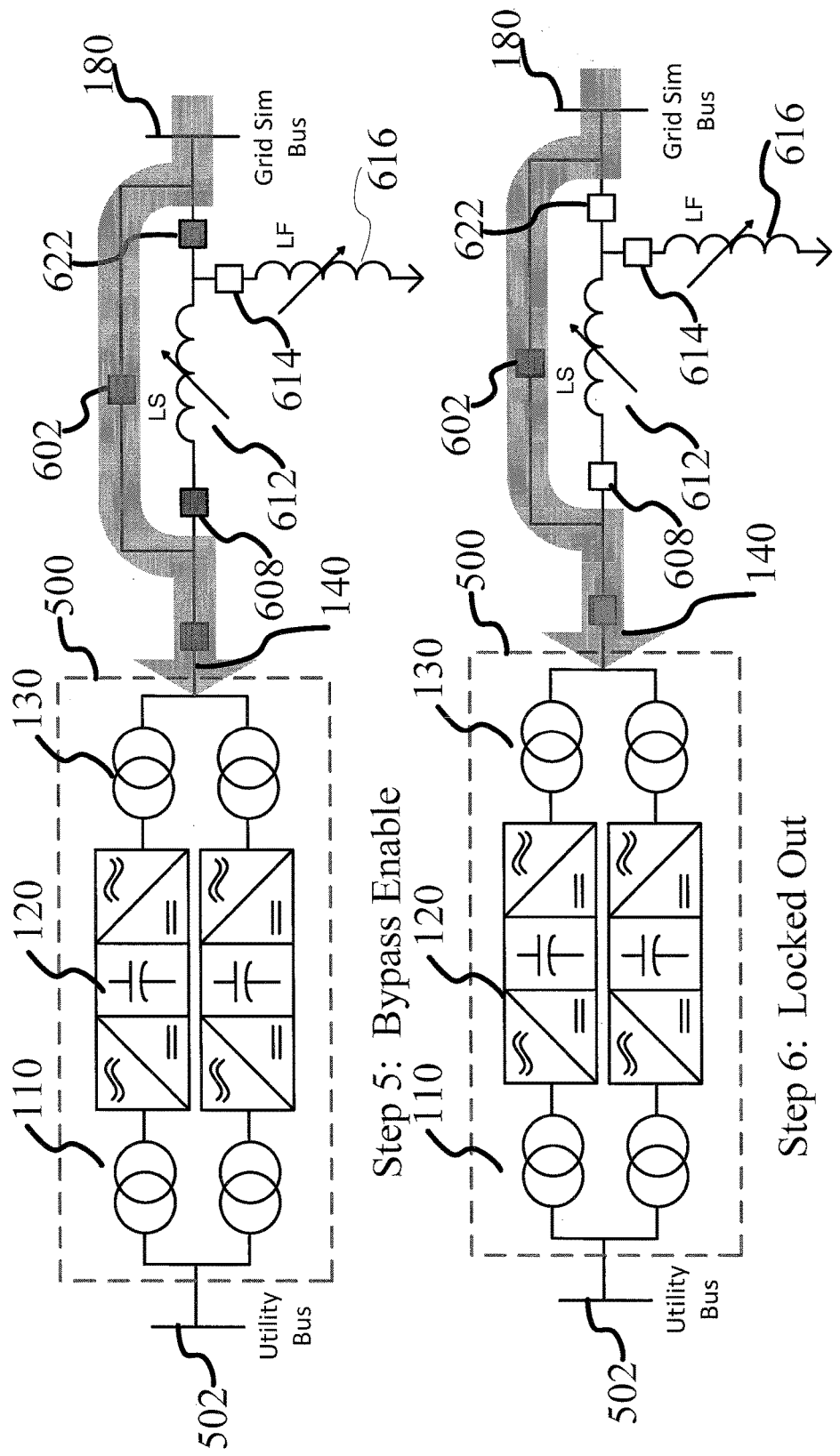
FIG. 9 is a one-line diagram indicating the fifth and sixth steps in a reactive divider fault simulation method of using an embodiment of the invention.

The reactive divider may be used to simulate faults in a number of ways as further illustrated by the example procedures set forth in FIGS. 7, 8, and 9. Referring now to FIG. 7, in step 1, grid simulator bus 180 is connected to power amplifier bus 140 and ultimately to utility bus 502 through amplifier 500 and bypass breaker 602. A typical procedure would occur as follows.

In step 1, switch 602 is closed so that the reactive divider is bypassed. If the values of series impedance 612 and current from the simulated grid bus 180 are known, the approximate voltage drop across the series impedance can be calculated as if it were in the circuit. In step 2, the series impedance 612 is inserted between the power amplifier bus 140 and the grid simulator bus 180 by opening the SCR series bypass switch 602 so that current begins to flow through the series impedance of the inductor 612.

As the voltage disturbance created by the series impedance 612 at the grid simulator bus 180 can be pre-calculated prior to opening the switch 602, this voltage drop can be compensated for by adjusting the voltage reference of the power amplifier 500 in conjunction with opening the switch opening in step 2. This method can mitigate the voltage disturbances commonly associated with switching inductive elements, especially if precise switch timing is available. This can be accomplished if the series bypass switch 602 was implemented with solid-state AC switches, such as SCR series bypass switches.

Referring now to FIG. 8, a simulated fault occurs in step 3 when breaker 614 is closed and current begins to flow from both simulator bus 180 and the power amplifier bus 140 through the shunt impedance 616. The current from the power amplifier bus 140 is limited by the series combination of the series and shunt impedances. Additionally, the driving voltage of power amplifier 500 can be adjusted and modulated in order to regulate the current sent to the fault from the power amplifier bus 140 in accordance with the Thevenin equivalent circuit. The driving voltage of the power amplifier 500 could also be adjusted in such a manner as to regulate the fault voltage by actually absorbing current from simulated grid bus 180. Additionally, power amplifier 500 could operate in a dual control mode where fault voltage regulation was desired but current limiting would take priority. In this embodiment, inductors 612 and 616 are variable to provide greater control in simulating faults in the grid, whereby each inductor is adjustable to allow the system to adjust the impact of the simulated electrical fault.

The fault is cleared in step 4 when breaker 614 is opened. After clearing of the fault in step 4, the power amplifier 500 voltage should return to the pre-fault value or follow some arbitrary reference voltage profile. It is important to note that power amplifier 500 could also continue to compensate for the voltage drop across the series impedance during steps 3 and 4.

Referring now to FIG. 9, step 5 places the system back into pre-insertion mode by closing bypass switch 602 so that current no longer flows through either inductor. If the power amplifier was continuing to compensate for the voltage drop across the series impedance prior to closing of the bypass switch 602, power amplifier 500 could return to an uncompensated output voltage such that the transition of removing the series impedance 612 was without disturbance.

Additionally, the transition of closing bypass switch 602 at a zero crossing of the phase current would promote a clean removal of the series impedance. The zero crossing of the phase current within the inductor indicates that the energy stored in the inductance is near zero, thus the energy must be nearly balanced between the power amplifier bus 140 and the simulated grid bus 180. Thus only a limited energy imbalance exists, which avoids a switching transient and achieves a smooth voltage transition.

The system is placed in lockout in the final step 6 by opening breakers 608 and 622 to fully remove the reactive divider from the system.

Figure 10:
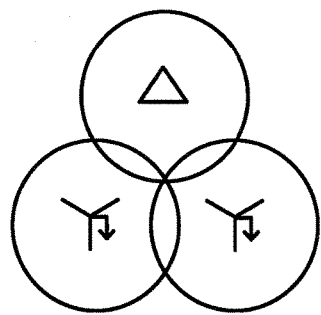
FIG. 10 is a one-line diagram of a transformer including an additional tertiary winding.
Figure 10:
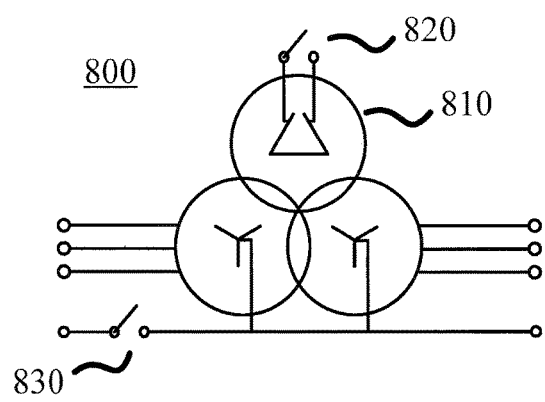

The invention also includes a novel transformer 800 as illustrated in FIG. 10. Where a typical three-phase transformer can be used to supply power, some additional items must be taken into account when marrying a variable frequency converter to a reactive divider network. Specifically, some non-symmetrical fault types will result in zero-sequence currents and care must be taken when evaluating transformer configurations. The purpose of this novel transformer 800 is to allow for two modes of operation, one where zero-sequence current is isolated between the primary and secondary windings and another where there exists a high reluctance to the application of zero-sequence voltage.

FIG. 10 illustrates a Y-Y, open-corner delta transformer with three windings. The Y windings consist of a neutral connection that is brought out to carry zero-sequence current from the primary to the secondary windings. Transformer 800 also includes an additional tertiary winding 810 that can be inserted or removed from the magnetic circuit by opening or closing the open corner delta switch 820. Additionally, the side of the transformer 800 connected to the power amplifier could have a neutral tie switch 830 that could be opened to isolate the variable frequency converter from any zero-sequence currents. In other words, an open corner delta tertiary 810 allows for zero-sequence current isolation from power amplifier 500 when the open corner delta switch 820 is closed and the neutral tie switch 830 is open. The zero-sequence impedance can also be adjusted by inserting impedance in series with the open corner delta switch 820. Conversely, if the neutral tie switch 830 is closed and the open corner delta switch 820 is opened, the transformer would allow for the passage of intentional zero-sequence current and voltage.

Figure 11:
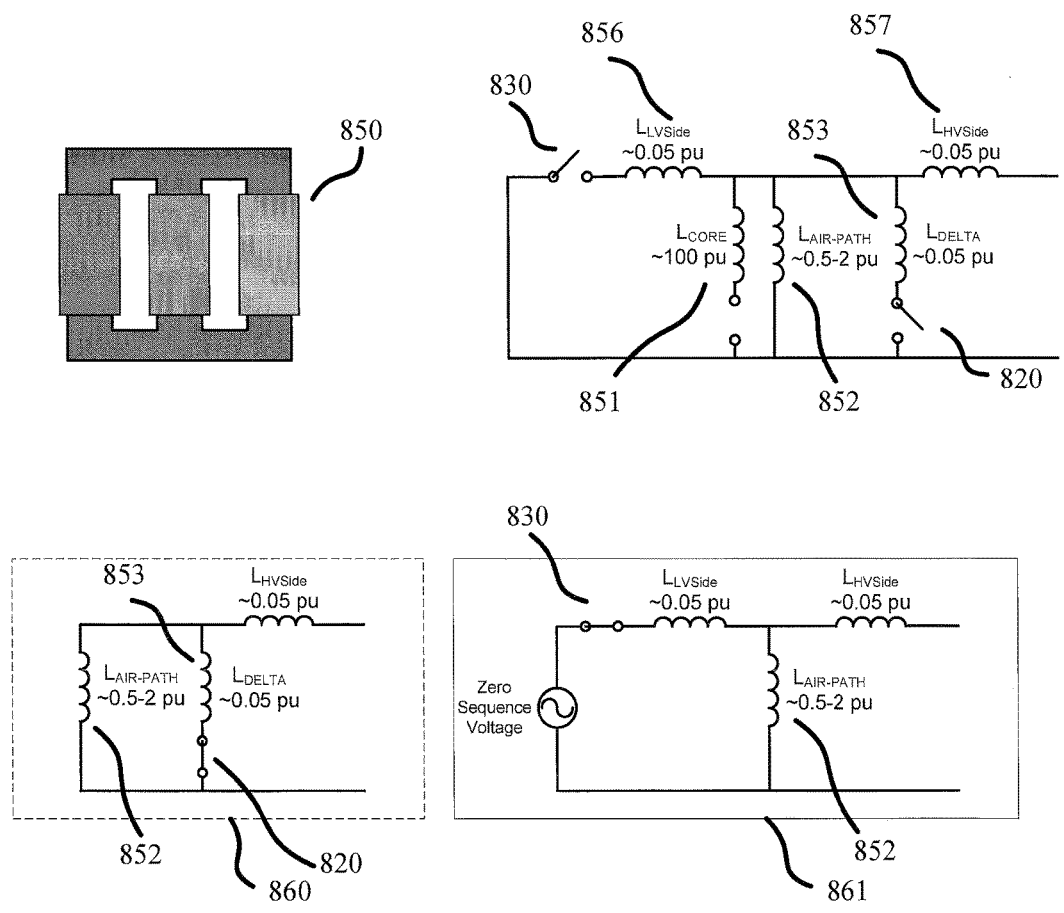
FIG. 11 is an illustration of a transformer containing a three-limb core and example circuits to illustrate its reaction in zero-sequence.

The above is not possible with a three-limb core as further illustrated in FIG. 11. A typical transformer 850 includes a three-limb core. The zero-sequence network in a three-limb core transformer 850 does not contain a low reluctance path for zero-sequence flux. This is demonstrated in the zero-sequence circuit in FIG. 11, where the typical low reluctance path of the core 851 is effectively an open circuit to zero-sequence flux. Thus the only path for zero-sequence flux is through the high reluctance, low inductance air-path 852, commonly referred to as the "tank" of the transformer. Zero-sequence injection circuit 861 indicates that if a user desired zero-sequence voltage emulation on the grid simulator bus, the magnetizing current would be significantly large due to the high air-path reluctance 852.

The zero-sequence isolation circuit 860 indicates that if during a fault scenario with the reactive divider network, the zero-sequence circuit was desired to be isolated from the amplifier, closing of delta switch 820 would provide a very low impedance path to zero-sequence currents; thus shunting the zero-sequence current away from the amplifier where the zero-sequence network can be isolated by opening the neutral tie switch 830.

Figure 12:
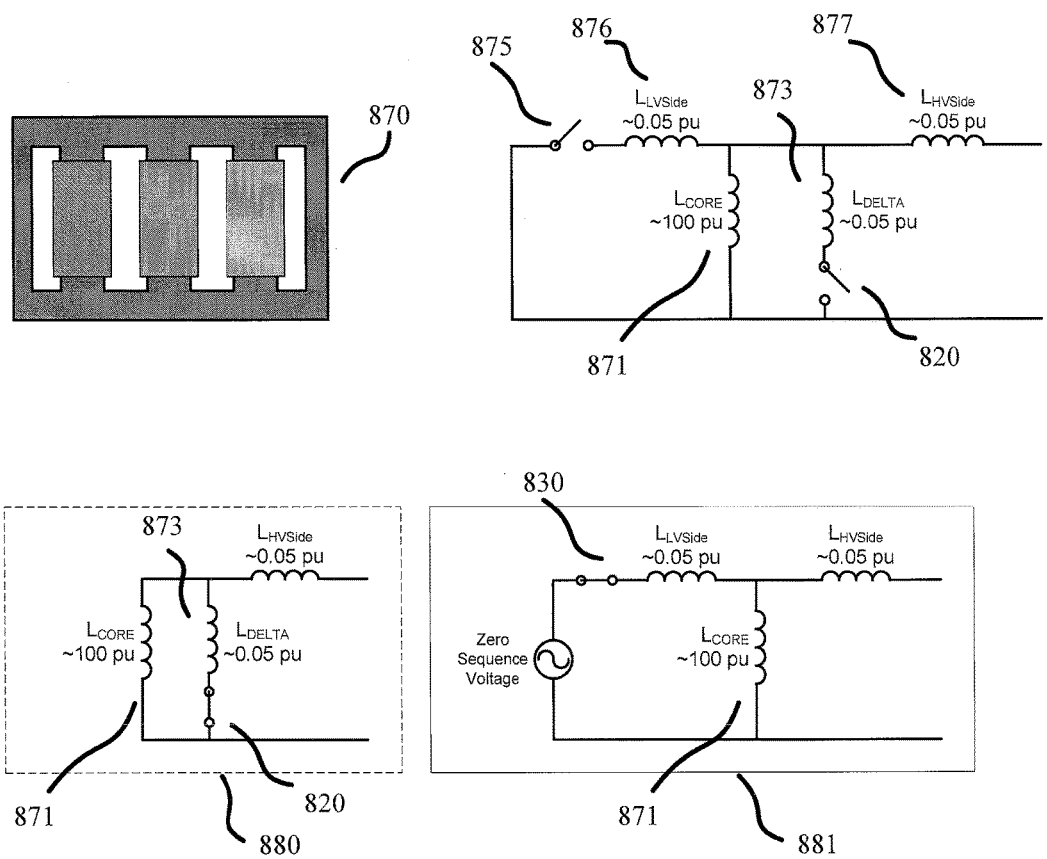
FIG. 12 is an illustration of a transformer containing a five-limb core and example circuits to illustrate its reaction in zero-sequence.

By contrast, the five-limb core of transformer 870 of FIG. 12 provides a natural low reluctance, high impedance magnetizing path for zero-sequence fields. The zero-sequence network in a five-limb core transformer 870 consists of a high impedance zero-sequence-magnetizing path 871 because the outer two limbs of the core provide a zero-sequence flux return path. This is in parallel with the same low impedance zero-sequence path created by the delta tertiary winding 873.

The zero-sequence injection circuit 881 indicates that if a user wishes to emulate zero-sequence voltages on the grid simulator bus, the magnetizing current would be dramatically lower than that of a three-limb core due to the low reluctance path of the core 871. The zero-sequence isolation circuit 880 indicates that closing of the delta switch 820 would provide a sufficiently low zero-sequence path 873 for isolation of the power amplifier given the neutral tie switch 830 was opened.

It is also important to note that a compromise between a three-limb core and five-limb core can be achieved by using three, single-phase transformers connected in a Yg-Yg bank. This method does not allow for zero-sequence isolation, but completely eliminates the need to manage zero-sequence fluxes within the transformer. This is because the transformers are all single phase with a common neutral point and each transformer and flux path is subjected to only positive sequence. This represents a more cost efficient method with the only drawback being that the power amplifier must be capable of handling possibly significant zero-sequence currents. These illustrated examples are offered by way of illustration of the invention's versatility and not meant to limit the invention in any way. The present invention may be embodied in other specific forms without departing from its spirit of essential characteristics. The described embodiments are to be considered in all respects only illustrative and not restrictive. The scope of the invention is, therefore, indicated by the appended claims, rather than by the foregoing description. All changes that come within the meaning and range of equivalency of the claims are to be embraced within their scope.

The invention claimed is:

1. An electrical grid simulation system for providing grid simulation to mimic and control parameters within an electrical grid comprising:
   a power amplifier;
   an isolation transformer comprising a tertiary delta winding and a switching means for controlling connection of said tertiary delta winding operatively connected to at least one corner of said tertiary delta winding; and
   a reactive divider operatively connected to a variable frequency converter, said reactive divider operating as a variable fault reactive device comprising a reactive impedance divider comprising one or more reactors per phase, wherein said reactive divider is capable of simulating a fault within an electrical grid by:
      connecting a first variable inductor in series with said power amplifier to allow the passage of current from a simulated bus grid to a utility bus grid;
      connecting a second variable inductor in parallel with said first variable inductor, connected in series with said power amplifier, to allow the passage of current from said simulated bus grid to ground simultaneously with the passage of current from said utility bus grid to ground, to create a simulated electrical fault; and
      adjusting said second variable inductor to increase or decrease the reactance appearing on said utility bus grid to adjust the impact of said simulated electrical fault.

2. An electrical grid simulation system for providing grid simulation to mimic and control parameters within an electrical grid comprising:
   a power amplifier;
   an isolation transformer; and
   a reactive divider operatively connected to a variable frequency converter, said reactive divider operating as a variable fault reactive device comprising a reactive impedance divider comprising one or more reactors per phase, wherein said reactive divider is capable of simulating a fault within an electrical grid by:
  connecting a first variable inductor in series with said power amplifier to allow the passage of current from a simulated bus grid to a utility bus grid;
  connecting a second variable inductor in parallel with said first variable inductor, connected in series with said power amplifier, to allow the passage of current from said simulated bus grid to ground simultaneously with the passage of current from said utility bus grid to ground, to create a simulated electrical fault; and
  adjusting said second variable inductor to increase or decrease the reactance appearing on said utility bus grid to adjust the impact of said simulated electrical fault.

3. An electrical grid simulation system for providing grid simulation to mimic and control parameters within an electrical grid comprising:
  a power amplifier; and
  a reactive divider operatively connected to a variable frequency converter, said reactive divider operating as a variable fault reactive device comprising a reactive impedance divider comprising one or more reactors per phase, wherein said reactive divider is capable of simulating a fault within an electrical grid by:
  connecting a first variable inductor in series with said power amplifier to allow the passage of current from a simulated bus grid to a utility bus grid;
  connecting a second variable inductor in parallel with said first variable inductor, connected in series with said power amplifier, to allow the passage of current from said simulated bus grid to ground simultaneously with the passage of current from said utility bus grid to ground, to create a simulated electrical fault; and
  adjusting said second variable inductor to increase or decrease the reactance appearing on said utility bus grid to adjust the impact of said simulated electrical fault.

\* \* \* \* \*